United States Patent [19]

Watanabe et al.

[11] Patent Number: 4,553,086
[45] Date of Patent: Nov. 12, 1985

[54] CARRIER POWER TO NOISE POWER RATIO MEASURING SYSTEM FOR TDMA SIGNALS

[75] Inventors: Tatsuo Watanabe; Michihisa Ohkawa; Toshio Mizuno, all of Tokyo, Japan

[73] Assignee: Kokusai Denshin Denwa Kabushiki Kaisha, Tokyo, Japan

[21] Appl. No.: 472,292

[22] Filed: Mar. 4, 1983

[30] Foreign Application Priority Data

Apr. 2, 1982 [JP] Japan .................................. 57-53921

[51] Int. Cl.[4] ............................................ G01R 27/00
[52] U.S. Cl. ................................................... 324/57 N
[58] Field of Search .......................... 324/57 N, 57 R; 328/162, 168; 455/214

[56] References Cited

U.S. PATENT DOCUMENTS 3,122,704  2/1964  Jones ................................. 324/57 N
3,350,643 10/1967  Webb ................................. 324/57 N Primary Examiner—Stanley T. Krawczewicz
Assistant Examiner—Jack B. Harvey
Attorney, Agent, or Firm—Pollock, Vande Sande and Priddy

[57] ABSTRACT

A system for measuring a carrier power to noise power ratio of a TDMA (Time Division Multiple Access) signal corrupted by noise comprises a detector for detecting the signal, a circuit to sample the output signal from the detector, a circuit for holding the sampled detector output, and an A/D converter for converting the signal held as described above into a digital quantity. A signal processor effects the measurement of the carrier power to noise power ratio of a signal under test by finding at least one of the squared average value, the average value, and the dispersion on the basis of the output of the aforementioned A/D converter.

2 Claims, 5 Drawing Figures

CARRIER POWER TO NOISE POWER RATIO MEASURING SYSTEM FOR TDMA SIGNALS

BACKGROUND OF THE INVENTION

1. Field of the Invention

This invention relates to a system for measuring the carrier power to noise power ratio of a TDMA signal transmitted through a wired or wireless transmission path.

2. Description of the Prior Art

A variety of communication methods have been heretofore developed and adopted for actual use as means for the transmission of information through transmission paths. In terms of pattern of transmission, they may be roughly divided into an analog communication method and a digital communication method. In the case of the digital communication methods, the communications are carried out both in a continuous mode and a burst mode.

As one criterion for the evaluation of the signal quality in transmission, the carrier power to noise power ratio (hereinafter referred to as C/N for short) at the receiving terminal is important.

With the conventional method for C/N measurement, since the signal components are dispersed in a frequency band where the modulated signal is included, it is difficult to separate noise from signal and measure C/N with high accuracy. For the signal of this kind, therefore, there is adopted either (1) a method which effects the measurement of C/N by extracting signal components during the absence of modulation through a filter and further measuring noise power in the band as extracted from its signal components, or (2) a method which effects the measurement of C/N by measuring noise power while the signal components are turned off, then with the signal turned on, measuring the sum of signal power and noise power, and calculating C/N based on the results of the foregoing measurements.

In the case of the burst mode in which the transmission is effected by a fixed cycle, the aforementioned methods (1) and (2) which inevitably involve use of a filter prove impracticable even if part of the burst signal should be extracted somehow or other. This is because the fixed-cycle burst signal contains a spectral component which depends on the repeating cycle in a frequency band and the signal or noise component to be measured cannot be separated owing to the obstacle by the spectral components.

Further, the aforementioned method (2) has the disadvantage that it fails to provide accurate measurement when the amplifier inserted in the transmission path operates in the nonlinear region.

SUMMARY OF THE INVENTION

The first object of this invention is to provide a system for the measurement of C/N of (1) a signal such as a burst signal which is repeated by the fixed cycle and has a fixed unmodulated portion in the burst, (2) a signal without any intersymbol interference at the sample point of signal (such as the digital phase-shift modulation signal transmitted through a communication system satisfying the conditions for Nyquist's first criterion), and (3) a signal such as an FM signal which does not have any amplitude modulated components. Particularly this invention is aimed at enabling the in-service measurement of C/N which has been heretofore found difficult to be effectively materialized.

The second object of this invention is to provide a system which enables C/N to be effectively obtained even when the amplifier or repeater inserted in the transmission line is operated in a nonlinear region.

This invention is characterized by enabling the C/N ratio measurement to be effected by the steps of detecting with a detector the received signal which is the sum of noise and a signal having a specific pattern cyclically, a signal without an intersymbol interference at the sample point of signal, or a modulated signal like an FM signal having constant envelope, converting the outputs of the detector into digital quantities, deriving from the resultant digital quantities at least one of the squared average value, the average value, and the variance of the aforementioned detector outputs, and subjecting the value thus found to a fixed processing operation.

DETAILED DESCRIPTION OF THE INVENTION

Now, the present invention will be described below with reference to working examples thereof. First, the invention will be described with reference to its application to a TDMA signal to be handled by a satellite link.

Figure 1:
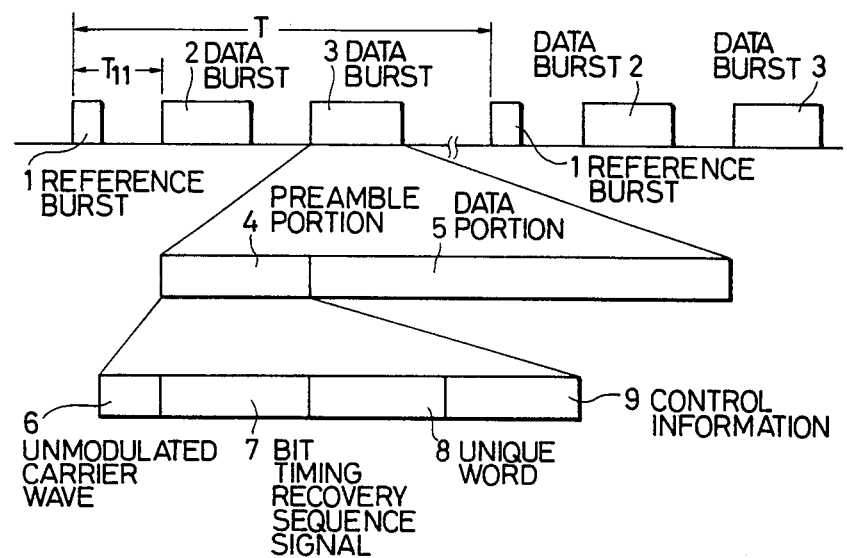
FIG. 1 is a structural diagram of a frame and a burst in a typical TDMA signal.

FIG. 1 represents an example of a TDMA signal. In this diagram, a numeral 1 denotes a reference burst, each of 2 and 3 denotes a data burst, T denotes a frame length representing the repetition cycle of the TDMA signal, and $T_{11}$ denotes the burst interval. One data burst 3 which constitutes the TDMA signal is composed of a preamble portion 4 and a data portion 5. In the illustrated example, the preamble portion 4 is composed of an unmodulated carrier wave 6, a bit timing recovery sequence signal 7, a unique word 8 showing the burst position, and control information 9. Here, the reference burst 1 is composed solely of the preamble portion 4.

Figure 2:
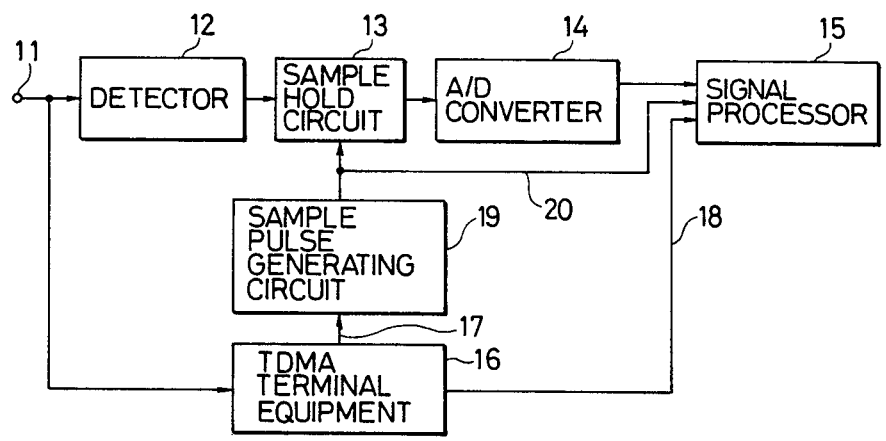
FIG. 2 is a block diagram illustrating the first embodiment of the present invention.

FIG. 2 represents the first embodiment of the present invention. In the diagram, numeral 11 denotes an input terminal for receiving the TDMA signal in the IF band, 12 denotes a detector such as an amplitude detector or a phase detector, 13 denotes a sample hold circuit, 14 denotes an A/D converter, 15 denotes a signal processor such as a micro-processor, and 16 denotes TDMA terminal equipment.

Further, 17 denotes a detection pulse of the unique word in the reference burst detected at the TDMA, terminal, 18 denotes a detection pulse of the unique word in the data burst, and 19 denotes a sample pulse generating circuit which is actuated in reponse to the reception of the detection pulse 17 of the unique word in the reference burst and produces a sampling pulse 20 after a predetermined time has elapsed.

Figure 3:
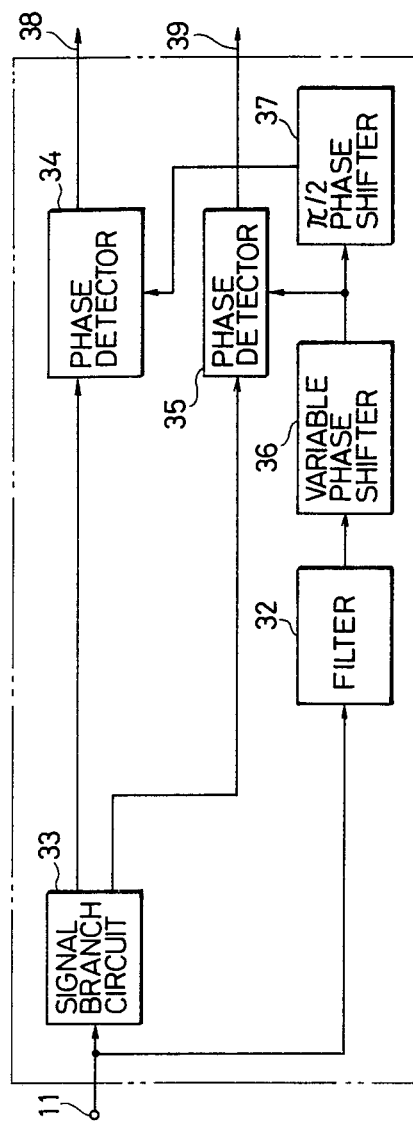
FIG. 3 is a block diagram illustrating a typical embodiment of the detector in the diagram of FIG. 2.

FIG. 3 represents a detail drawing of the detector 12. In the diagram, 11 denotes the signal input terminal, 32 denotes a filter, 33 denotes a signal branch circuit such as a hybrid, each of 34 and 35 denotes a phase detector, 36 denotes a variable phase shifter, 37 denotes a $\pi/2$ phase shifter, and each of 38 and 39 denotes a phase detector output.

Now, the operation of the first embodiment of this invention illustrated in FIG. 2 will be described below with respect to the system wherein the signal constitutes, e.g., burst signal which is repeated by a fixed cycle and has a fixed unmodulated portion without any intersymbol interference.

The input to the input terminal 11 is an IF signal which is the sum of a burst signal and noise. It is represented by the following formula.

$$A \cos \omega_0 t + x(t) \cos \omega_0 t - y(t) \sin \omega_0 t \quad (1)$$

wherein, A and $\omega_0$ respectively denote the amplitude and the carrier angle frequency of the modulated wave, and $x(t)$ and $y(t)$ denote the amplitudes of the low-frequency components of the noise which are called an in-phase noise and a quadrature noise respectively.

When an input signal having the formula (1) is subjected to synchronous detection by the detector 12, the outputs 38, 39 from the detector 12 are represented by the following formulas.

(a) The outcome of the detection of $\cos \omega_0 t$, namely, the output 38 from the phase detector 34 in the diagram of FIG. 3, is as follows.

$$A + x(t) \quad (2)$$

This output is called an in-phase component.

(b) The outcome of the detection of $\sin \omega_0 t$, namely, the output 39 from the phase detector 35 in the diagram of FIG. 3 is as follows.

$$y(t) \quad (3)$$

This output is called a quadrature component.

The variable phase shifter 36 shown in FIG. 3 is adjusted so that the outputs of the aforementioned formulas (2), (3) are derived from the phase detectors 34, 35 respectively.

Then, the detector outputs represented by the formulas (2), (3) are sampled by the sample hold circuit 13 in accordance with the timing of the sampling pulse 20. This sampling pulse 20 is produced by the sample pulse generating circuit 19 as shown below, for example.

The burst interval $T_{11}$, namely the interval between the head of the reference burst 1 and the head of the data burst 2, is known in advance. The sample pulse generating circuit 19 is formed of a counter, for example. Thus, the counter is reset by the unique word detection pulse 17 detected in the TDMA terminal equipment 16 and the count corresponding to the burst interval $T_{11}$ is taken by using the clock from the TDMA terminal equipment 16. Then, the pulse issued on completion of the counting of the burst interval $T_{11}$ causes the detector output to be sampled in the unmodulated portion 6 at the head of the data burst 2. Thereafter, the sampling is performed at intervals of a frame cycle of TDMA or a cycle which is equal to the product of the frame cycle multiplied by an integer.

Assume that one sampling is performed at the time, $t + nT'$ (wherein, n is an integer and $T'$ is a sampling cycle which is equal to a frame cycle T of TDMA or a cycle obtained as the product of the frame cycle multiplied by an integer), then the outputs from the sample hold circuit 13 will be given by the following formula.

$$A + x_n; \text{ In-phase component} \quad (4)$$

$$y_n; \text{ Quadrature component} \quad (5)$$

wherein, $x_n = x(nT')$ and $y_n = y(nT')$.

The outputs from the sample hold circuit 13 are converted by the A/D converter 14 into digital quantities and these quantities are supplied to the signal processor 15. In the signal processor 15, the sample values represented by the aforementioned formulas (4), (5) are subjected to N sample accumulation to find squared averages of the in-phase component and quadrature component. In other words, the operations of the formulas (6), (7) shown below are performed in the signal processor 15.

$$\frac{1}{N} \sum_{n=1}^{N} (A + x_n)^2 = \frac{1}{N} \sum_{n=1}^{N} A^2 + \frac{1}{N} \sum_{n=1}^{N} x_n^2; \quad (6)$$

In-phase component $$\frac{1}{N} \sum_{n=1}^{N} y_n^2; \quad (7)$$

Quadrature component

Mathematically, as the in-phase component of the formula (6), the term $$\frac{2}{N} \sum_{n=1}^{N} A x_n$$

ought to appear in the right member of the equation. Since this term represents the average of noise component, it assumes the value of 0. Thus, this term $$\frac{2}{N} \sum_{n=1}^{N} A x_n$$

is omitted from the equation (6).

When the sample number N is sufficiently large and the operation is in linear form, the following values are obtained.

$$\frac{1}{N} \sum_{n=1}^{N} A^2; \text{ Signal power} \quad (8)$$

$$\frac{1}{N} \sum_{n=1}^{N} x_n^2 = \frac{1}{N} \sum_{n=1}^{N} y_n^2; \text{ Noise power} \quad (9)$$

Since the formulas (6), (7) show that the quadrature component equals the noise power and the difference (in-phase component-quadrature component) equals the signal power, the circuit C/N ratio is found by the quotient of (in-phase component-quadrature component)/(quadrature component).

On the other hand, the in-phase noise contained in the signal which has been affected by the nonlinear property such as, for example, the saturation property of the amplifier satisfies the relation $$\frac{1}{N} \sum_{n=1}^{N} A^2 >> \frac{1}{N} \sum_{n=1}^{N} x_n^2$$

because its amplitude is compressed in the nonlinear relation. In the case of the quadrature noise, since the said effect is substantially negligible, an effective C/N can be obtained by the division of (in-phase component)/(quadrature component).

In a TDMA operation using an actual satellite link, the transmission bursts from the stations on the earth are not necessarily transmitted to a fixed position in each frame possibly because of variation in the position of the satellite or variation in the clock frequency.

In the formation of the sampling pulse by the use of the unique word detection pulse of the reference burst, therefore, if the burst position deviates significantly, then the pulse position for the sample production relative to the prescribed unmodulated portion may possibly deviate so much as to effect the sampling at a portion other than the portion actually aimed at and the results of C/N measurement may be subjected to an error.

The embodiment under discussion, therefore, allows for a certain width of variation in the burst position. To be specific, this allowance is accomplished as follows. The sampling pulse 20 and the unique word detection pulse 18 for the data burst are supplied to the signal processor 15 so that the main function of the processor 15 may determine the time relation between the two pulses. When the relation deviates by more than the predetermined value, the data from the A/D converter 14 are excluded from the subsequent operation.

Although the C/N measurement described above has made use of the unmodulated portion of the TDMA, this unmodulated portion may be omitted depending on the configuration of the preamble pattern of the TDMA signal. In an ordinary case, however, the fixed pattern signal for recovery of the carrier wave and the bit timing recovery sequence is added. Normally, this fixed pattern is formed in a binary PSK (phase shift keying) (0 and $\pi$ phases). In this case, since no synchronous detection is obtained with the aforementioned circuit configuration of FIG. 2, it becomes necessary either to adopt a delay detection circuit or a carrier wave regenerating circuit to produce a reference phase signal for the phase detector.

Figure 4:
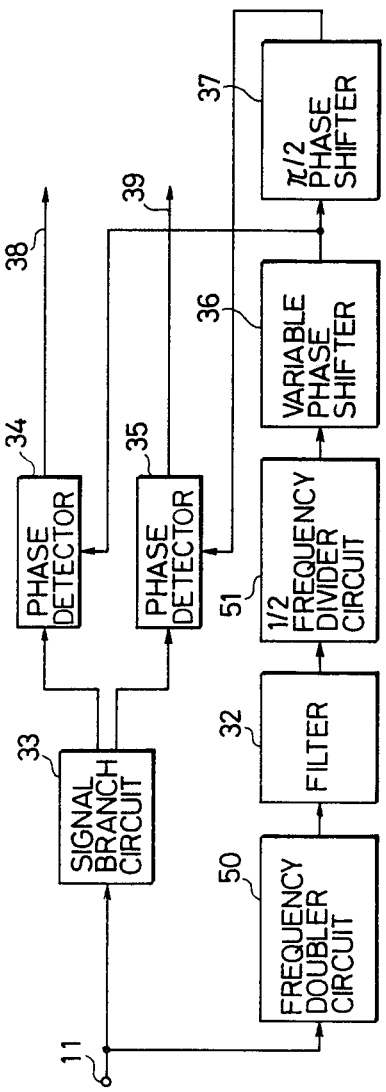
FIG. 4 is a block diagram illustrating another typical embodiment of the detector.

A typical case wherein the reference phase signal for the phase detector is produced by the use of the carrier wave regenerating circuit will be described with reference to FIG. 4. In this embodiment, the binary PSK wave is converted by the frequency doubler circuit 50 into an unmodulated wave and then fowarded via the filter 32 to the ½ frequency divider circuit 51. Then, the output signal from the ½ frequency divider circuit 51 is forwarded to the variable phase shifter 36, there to cause formation of the reference phase signal for the phase detector 34. By the delivery of the output from the variable phase shifter 36 to the $\pi/2$ phase shifter 37, there is effected formation of the reference phase signal for the phase detector 35. In FIG. 4, the other symbols used designate parts which are either identical or equivalent to those used in the system of FIG. 3.

Now, the second embodiment of this invention will be described below. With the embodiment the method for C/N measurement of the digital phase modulated signal without any intersymbol interference at the signal sampling point with respect to a quaternary phase shift signal will be explained. In this case, the formation of the reference phase signal necessary for phase detection is accomplished by using a frequency quadrupler circuit and a ¼ frequency divider in the place of the frequency doubler 50 and the ½ frequency divider 51 respectively, in the configuration of FIG. 4.

The quaternary phase shifted wave including noise and being supplied to the input terminal 11 is represented by the following formula.

$$A(t) \cos (\omega_0 t + \theta(t)) + x(t) \cos \omega_0 t - y(t) \sin \omega_0 t \qquad (10)$$

wherein, A(t) denotes the amplitude of a modulated wave and $\theta(t)$ denotes a modulated signal the phase of which is one of the four values, $0, \pm \pi/2$, and $\pi$.

When the input represented by the formula (10) is processed by the phase detectors 34 and 35, the outputs of the detectors are as indicated respectively by the formulas (11), (12) shown below.

$$A(t)\cos\theta(t) + x(t) = \begin{cases} A(t) + x(t); \ \theta(t) = 0 \\ x(t); \ \theta(t) = \pi/2 \text{ or } -\pi/2 \\ -A(t) + x(t); \ \theta(t) = \pi \end{cases} \qquad (11)$$

$$A(t)\sin\theta(t) + y(t) = \begin{cases} A(t) + y(t); \ \theta(t) = \pi/2 \\ y(t); \ \theta(t) = 0 \text{ or } \pi \\ -A(t) + y(t); \ \theta(t) = -\pi/2 \end{cases} \qquad (12)$$

The outputs from the detector 12 represented by the formulas (11), (12) are supplied to the sample hold circuit 13. The outputs from the sample hold circuit 13 are subjected to A/D conversion and then injected into the signal processor 15.

In the sample pulse generating circuit 19, a sample pulse is generated at the time when the eye pattern of the output of the detector 12 is opened to the maximum degree.

In the signal processor 15, the absolute values of the sample values corresponding to the two phase detector outputs represented by the formulas (11), (12) are temporarily settled at first. When the value of C/N is relatively large, the larger one of the two absolute values is taken up in the signal processor 15 because the signal component is included in the larger one. And the series of sample values corresponding to the larger absolute value are processed to determine their average and variance. The average and variance of the series of sample values are as represented respectively by the following formulas (13), (14).

$$\frac{1}{N} \sum_{n=1}^{N} (A_0 + x_n) = \frac{1}{N} \sum_{n=1}^{N} A_0 = A_0 \qquad (13)$$

$$\frac{1}{N} \sum_{n=1}^{N} (A_0 + x_n)^2 - \left( \frac{1}{N} \sum_{n=1}^{N} (A_0 + x_n) \right)^2 = \frac{1}{N} \sum_{n=1}^{N} x_n^2 \qquad (14)$$

wherein, $A_0$ is $A(nT')$.

The formula (13) represents the amplitude of the modulated wave and the formula (14) the noise power. The C/N ratio of the circuit under test, therefore, can be determined on the basis of the formulas (13), (14).

It will be self-evident that the C/N can also be calculated solely on the basis of the squared averages of the formulas (11), (12) as indicated by the formulas (6), (7) of the first embodiment instead of calculating the C/N by finding the average and variance represented by the formulas (13), (14) just mentioned above.

It will be also self-evident that conversely in the case of the first embodiment which handles the signal such as the burst signal repeated at a fixed cycle and possessed of a fixed unmodulated portion without any intersymbol interference as already described with reference to the formulas (6) through (9), the average and the variance can be determined as described already in the second embodiment with reference to the formulas (13), (14) and the C/N can be calculated by using the average value as the signal power and the variance as the noise power respectively instead of calculating the C/N solely on the basis of the squared average value.

So far, the operation of the present invention on the phase modulated wave has been described with respect to the method of quaternary phase shift keying. It will be self-evident, however, that this invention can be effectively applied to a binary phase shift keying wave (in which case only the formula (11) is applicable) and other phase shift keying waves.

Now, the third embodiment of this invention will be described below with reference to FIG. 5. This embodiment represents a case wherein this invention is applied to an FM signal which has no amplitude modulated wave component. Basically, it is the same as the method of C/N measurement for the burst signal. Since the FM signal involves continuous phase shift, it is inherently impossible to measure a phase noise. On the FM signal, therefore, the measurement is effected only with respect to the amplitude component.

Figure 5:
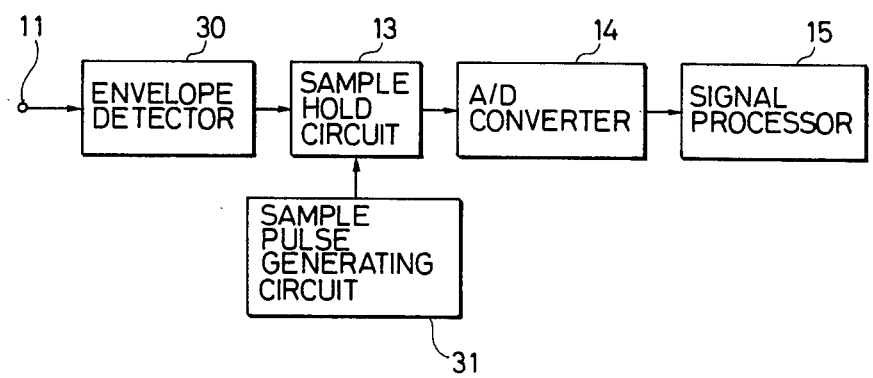
FIG. 5 is a block diagram of the third embodiment of this invention.

In FIG. 5, numeral 30 denotes an envelope detector and 31 denotes a sample pulse generating circuit. The other symbols used in this diagram denote the parts which are identical or equivalent to the parts indicated in FIG. 2.

Now, the operation of this embodiment will be described below. First, the envelope of the input signal is detected by the envelope detector 30. By the pulse from the sample pulse generation circuit 31, the output from the envelope detector 30 is sampled and held in the sample hold circuit 13. Subsequently, the sampled output is converted by the A/D converter 14 into a digital quantity and injected into the signal processor 15.

Here, the cycle for generation of a sample pulse is suitably selected in accordance with the processing speed of the signal processor 15. The analog quantity of the sample hold circuit 13 is equivalent to the formula (2) and the variation in the output of the envelope detector 30 depends on the amount of noise. In the signal processor 15, therefore, the C/N can be determined by finding the average value of detection signal and its variance as represented by the formulas (13), (14).

The embodiments so far described are based on the assumption that no variation of signal level occurs while a required number of samples is obtained. When this invention is applied to a link in which variation of level may arise, therefore, it is desirable to have an AGC (automatic level control circuit) inserted before the C/N measuring means.

As described above, the method of this invention effects C/N measurement statistically by sampling signals on the time base. Thus, it permits ready C/N measurement of not only FM signals but also TDMA signals. Even when the repeater is operated in a nonlinear region as in a TDMA system involved in a satellite link, the method of this invention permits effective C/N measurement through measurement of the phase component (quadrature component) of the signal involved.

Heretofore, since no C/N measurement such as of an FM signal could be obtained during the actual use of the signal, the C/N of the input signal has been indirectly measured on the basis of the signal power to noise power ratio of the signal which has been demodulated. By adopting the method of this invention, the C/N measurement can be easily effected on the signal which has not yet been demodulated. In a system wherein multiple FM signals are received, one measuring apparatus of this invention can be effectively used in a time-shared manner.

What is claimed is:

1. A system for measuring the carrier power to noise power ratio in a noise-containing TDMA signal, which comprises:

a detector for detecting said TDMA signal, means for detecting a unique word in said TDMA signal and operative to supply a detection pulse in response to the unique word in the reference burst portion of said signal and a further detection pulse in response to the unique word in a data burst portion of said signal, means for predicting an unmodulated carrier wave of the preamble portion of said TDMA signal based on the output timing of said detection pulse of the unique word in the reference burst portion of said signal and operative to generate a pulse signal for sampling said unmodulated carrier wave, means disposed after said detector for sampling the output signal of said detector based on said pulse signal for sampling, a circuit for holding the detector output samples, an A/D converter coupled to said holding circuit for converting said detector output samples into a digital quantity, and a signal processor for receiving said digital quantity, said pulse signal for sampling, and said detection pulse of the unique word in the data burst as inputs, said signal processor being operative to nullify said A/D converter output whenever the deviation of the input timing between said pulse signal for sampling and said detection pulse of the unique word in the data burst exceeds a prescribed tolerance, said signal processor being further operative to find at least one of the squared average value, the average value, and the dispersion of the A/D converter output, and to calculate the carrier power to noise power ratio based on said value.

2. A system according to claim 1 wherein said detector is a phase detector.

* * * * *